United States Patent [19]

Oki

[11] 3,927,382

[45] Dec. 16, 1975

[54] AMPLIFYING CIRCUIT

[75] Inventor: Ryuji Oki, Tokyo, Japan

[73] Assignee: Sony Corporation, Tokyo, Japan

[22] Filed: Sept. 24, 1974

[21] Appl. No.: 509,020

[30] Foreign Application Priority Data

Oct. 2, 1973 Japan ........................ 48-115042[U]

[52] U.S. Cl. ........................ 330/29; 330/19; 330/25; 330/30 D; 330/145

[51] Int. Cl.$^2$ ........................ H03G 3/30

[58] Field of Search ....... 330/19, 25, 29, 30 D, 145; 325/319

[56] References Cited

UNITED STATES PATENTS

| | | | |
|---|---|---|---|
| 3,454,892 | 7/1969 | Knowles | 330/29 |
| 3,469,195 | 9/1969 | Harwood | 330/25 X |
| 3,579,112 | 5/1971 | Harford | 330/29 |
| 3,764,931 | 10/1973 | Waku et al. | 330/29 |

*Primary Examiner*—James B. Mullins
*Attorney, Agent, or Firm*—Lewis H. Eslinger; Alvin Sinderbrand

[57] ABSTRACT

In an amplifying circuit having a plurality of amplifier stages which are DC-coupled, and in which an AGC voltage is applied to one of the earlier amplifier stages for providing an AGC operation; changes in the DC level of a later amplifier stage resulting from the AGC operation are detected, and such detected changes in the DC level are cancelled at the DC-coupling between the earlier and later amplifier stages.

3 Claims, 1 Drawing Figure

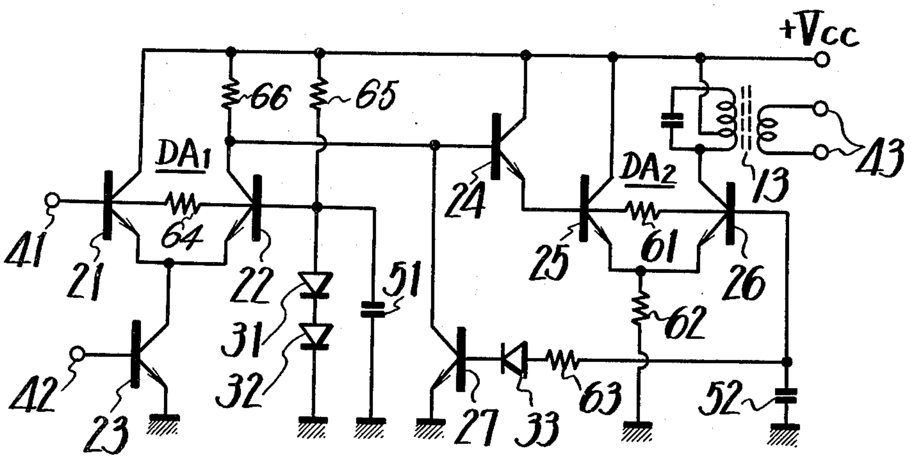
+Vcc
66
65
DA1
DA2
41
21
64
22
31
32
51
42
23
24
25
61
26
13
43
62
27
33
63
52

AMPLIFYING CIRCUIT

BACKGROUND OF THE INVENTION

1. Field of the Invention

This invention relates generally to amplifying circuits, and more particularly is directed to improvements in amplifying circuits with automatic gain control (AGC).

2. Description of the Prior Art

In general, when an intermediate frequency amplifying circuit for a radio receiver is formed of separately produced transistors and other elements, an intermediate frequency transformer and transistors providing a plurality of amplifier stages are alternately connected in cascade. However, when at least the transistors constituting the plural amplifier stages are formed as an integrated circuit, such amplifier stages are connected in cascade by direct connections or DC-couplings therebetween, and an intermediate frequency transformer or ceramic filter is connected in cascade, as an aggregate, to the integrated circuit.

However, when automatic gain control (AGC) operation is desired in an integrated circuit intermediate frequency amplifier according to the prior art, as described above, the automatic gain control signal is applied to an earlier amplifier stage and, by reason of the DC-coupling of the several stages, the DC level of a later amplifier stage is also changed. Therefore, the transistor transistors of the later amplifier stage are shifted from their normal operating point in response to automatic gain control operation and problems arise in respect to maintaining the desired dynamic range and output level of the amplifying circuit.

SUMMARY OF THE INVENTION

Accordingly, it is an object of the present invention to provide an improved amplifying circuit which can be provided with automatic gain control operation without encountering the above problems of the prior art.

It is another object of the invention to provide an amplifying circuit having plural amplifier stages, and in which the DC level of a later amplifier stage is not changed with an AGC signal applied to an earlier stage.

A further object is to provide an amplifying circuit, as aforesaid, in which dynamic range and output level are not adversely affected by the AGC operation.

A still further object of the invention is to provide an amplifying circuit in which transistors or the like providing a plurality of amplifier stages can be formed as an integrated circuit.

In accordance with an aspect of this invention, an amplifying circuit comprising earlier and later amplifier stages having a direct connection therebetween so as to be DC coupled, and means for effecting automatic gain control of an earlier amplifier stage, is provided with means for detecting changes in the DC level of the later amplifier stage resulting from changes in the gain of said earlier amplifier stage, and means controlled in response to the detected changes in the DC level of the later stage for cancelling the same at the direct connection between said amplifier stages.

In a preferred embodiment of the invention in which the amplifier stages are constituted by respective transistors which can be conveniently formed as an integrated circuit, the changes in the DC level of the later amplifier stage are detected at the base electrode of an amplifier of such stage and are used to control a variable impedance element which is connected between a reference voltage point and the direct connection or DC-coupling between the stages so as to cancel such changes in the DC level of the later stage.

The above, and other objects, features and advantages of the invention, will be apparent in the following detailed description of an illustrative embodiment which is to be read in connection with the accompanying drawing.

BRIEF DESCRIPTION OF THE DRAWING

The single FIGURE of the drawing is a circuit diagram showing an amplifying circuit according to one embodiment of the present invention.

DESCRIPTION OF THE PREFERRED EMBODIMENT

Referring to the drawing in detail, it will be seen that the present invention is there shown applied to an intermediate frequency amplifier for a radio receiver which includes first and second differential amplifiers $DA_1$ and $DA_2$. The first differential amplifier $DA_1$, which forms a first amplifier stage, is constituted by a pair of transistors 21 and 22 having their base electrodes connected to each other, as through a resistor 64. The base electrodes of transistors 21 and 22 are supplied with a constant bias voltage through a series circuit of a resistor 65 and diodes 31 and 32 connected between a voltage source terminal $+V_{cc}$ and a point of reference voltage or potential, such as the ground, and which has the base electrode of transistor 22 connected to such series circuit between resistor 65 and diode 31. The base electrode of transistor 21 is supplied with an intermediate frequency signal by way of an input terminal 41, and the base electrode of transistor 22 is further connected to ground or reference potential through a by-pass capacitor 51. The emitter electrodes of transistors 21 and 22 are connected together to the collector of a transistor 23 which functions as a constant current source. The base electrode of transistor 23 is supplied with a conventionally produced AGC voltage or signal through an input terminal 42, and the emitter electrode of transistor 23 is connected to ground or reference voltage or potential. The collector electrode of transistor 21 is directly connected to voltage source terminal $+V_{cc}$, while the collector electrode of transistor 22 is connected to that terminal through a resistor 66.

Further, the collector electrode of transistor 22 is directly connected or DC-coupled to the base electrode of an emitter follower type transistor 24 whose emitter electrode is directly connected or DC-coupled to the base electrode of a transistor 25. The transistor 25 and a transistor 26 form the second differential amplifier $DA_2$ which, together with transistor 24, constitute a second or later amplifier stage. The emitter voltage of transistor 24 is applied, as a bias, to the base electrode of transistor 25 and, through a resistor 61, to the base electrode of the transistor 26. The base electrode of transistor 26 is connected with ground or reference potential through a by-pass capacitor 52. The emitter electrodes of transistors 25 and 26 are connected together to a resistor 62 which is, in turn, connected to ground and serves as a constant current source. The collector electrode of transistor 26 is connected to an intermediate frequency transformer 13, and the collector electrode of transistor 25 is connected to voltage source terminal $+V_{cc}$. The amplified intermediate frequency signal is obtained at output terminals 43 which are connected to the secondary winding of transformer 13.

It will be apparent that, with the amplifying circuit described above, an intermediate frequency signal applied to input terminal 41 is amplified as it travels along the signal path through transistors 21, 22, 24, 25 and 26 and transformer 13 to output terminals 43. During such amplifying of the intermediate frequency signal, an AGC voltage or signal produced by any well known or conventional means (not shown) and applied to terminal 42 is effective to vary the conductivity of the collector-emitter path of transistor 23, and thereby varies the collector currents of transistors 21 and 22 for achieving the desired AGC operation. However, by reason of the DC-coupling between the amplifier stages, the operation point of transistors 25 and 26 in the second or later amplifier stage is varied in response to changes in the AGC voltage or signal applied to the earlier or first amplifier stage. For example, in the illustrated embodiment, when the collector current of transistor 23 is decreased in response to a decrease in the AGC voltage, the collector current of transistor 22 is also decreased to increase its collector voltage applied to the base electrode of emitter follower transistor 24. Thus, the base voltage or DC level of transistors 25 and 26 increases, that is, their operation point is varied to reduce the dynamic range and output level of the amplifying circuit.

In order to avoid the foregoing problem, the illustrated circuit according to this invention further detects the change in the base voltage or DC level of transistors 25 and 26 in the second amplifier stage resulting from variation of the AGC voltage or signal, and, in response to such detected change in the DC level, cancels the change in DC level at the input to such second stage, for example, at the direct connection or DC coupling between the stages.

More specifically, in the illustrated embodiment, the base electrode of transistor 26 is connected through a detecting resistor 63, and a diode 33 for level-shifting a DC current, to the base electrode of a transistor 27 which serves as a variable impedance and has its collector and emitter electrodes connected to the base electrode of transistor 24 and to the ground or reference potential or voltage. It will be apparent that, with the exception of capacitors 51 and 52 and transformer 13, all of the elements of the amplifying circuit according to this invention, as described above, can be conveniently formed as an integrated circuit.

With the circuit shown in the drawing, when the collector current of the transistor 22 is, for example, reduced in response to a decrease in the AGC voltage, the base voltage of transistors 25 and 26 tends to be increased thereby. However, when the base voltage of transistor 26 is increased, the base voltage of transistor 27 is also increased to increase its collector current, that is, to decrease its effective impedance. Thus, the base voltage of transistor 24 is lowered and, consequently, the base voltage of transistors 25 and 26 is decreased. In other words, the increase in the base voltage of transistors 25 and 26 which results from the decrease in the collector current of transistor 22, is canceled. Accordingly, even if the collector current of transistor 22 is varied with the AGC voltage, the base voltage of transistors 25 and 26 is kept substantially constant and accordingly, the operation point of transistors 25 and 26 is not changed. As a result, reduction of the dynamic range and output level of the amplifying circuit is prevented by the addition of simple elements to the basic amplifying circuit. It will be noted that such additional elements, to wit, transistor 27, diode 33 and resistor 63, can be easily integrated with the other described elements of the intermediate frequency amplifying circuit.

Although the invention has been described as applied to an amplifying circuit having pairs of transistors 21 and 22, and 25 and 26 forming differential amplifiers as the first and second stages, such stages may be formed by single transistors. Further, the present invention can be applied to other than the illustrated intermediate frequency amplifier of a radio receiver, for example, to the amplifier of a tape recorder provided with AGC operation.

Having described an illustrative embodiment of the invention with reference to the accompanying drawing, it is to be understood that the invention is not limited to that precise embodiment, and that various changes and modifications may be effected therein by one skilled in the art without departing from the scope or spirit of the invention as defined in the appended claims.

What is claimed is:

1. An amplifying circuit comprising a source of operating potential; a source of reference potential; a first amplifier stage including at least one transistor having a base electrode for receiving an input signal, a collector electrode connected to said source of operating potential and an emitter electrode; means for effecting automatic gain control of said first amplifier stage including a transistor having a base electrode adapted to receive a gain control signal and an emitter-collector path connected between said emitter of said transistor of the first amplifier stage and said source of reference potential; a second amplifier stage including an emitter-follower transistor and at least one additional transistor having a base electrode connected to the emitter of said emitter-follower transistor and collector and emitter electrodes respectively connected to said source of operating voltage and to said source of reference potential; a direct connection between said collector electrode of said one transistor of the first amplifier stage and the base electrode of said emitter-follower transistor for DC-coupling of said first and second amplifier stages; detecting means connected with said base electrode of said one additional transistor of the second amplifier stage for detecting changes in the DC level of said second amplifier stage resulting from changes in the gain of said first amplifier stage and for providing an output signal corresponding to the detected DC level change; and means for cancelling said changes in the DC level of said second amplifier stage including a transistor having a base electrode connected to said detecting means for receiving said output signal from the latter and collector and emitter electrodes respectively connected to said base electrode of the emitter-follower transistor and to said source of reference potential for varying the impedance therebetween in accordance with said output signal.

2. An amplifying circuit according to claim 1; in which said detecting means includes a resistor and diode connected in series between said base electrode of said one additional transistor of the second amplifier stage and the base electrode of said transistor of said means for cancelling the changes in said DC level.

3. An amplifying circuit according to claim 1; in which said first amplifier stage further includes a second transistor connected in a differential amplifier configuration with said one transistor of said first amplifier stage; and said second amplifier stage includes a second additional transistor connected in a differential amplifier configuration with said one additional transistor of said second amplifier stage.

* * * * *